US010255850B2

(12) United States Patent
Cho et al.

(10) Patent No.: US 10,255,850 B2
(45) Date of Patent: Apr. 9, 2019

(54) PIXEL WITH CURRENT DIFFUSION, METHOD OF DRIVING THE PIXEL, AND ORGANIC LIGHT EMITTING DISPLAY DEVICE INCLUDING THE PIXEL

(71) Applicant: SAMSUNG DISPLAY CO., LTD., Yongin-si, Gyeonggi-do (KR)

(72) Inventors: Young Jin Cho, Yongin-si (KR); Young In Hwang, Yongin-si (KR); Yong Jae Kim, Yongin-si (KR); Deok Young Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 329 days.

(21) Appl. No.: 15/064,518

(22) Filed: Mar. 8, 2016

(65) Prior Publication Data

US 2017/0025060 A1 Jan. 26, 2017

(30) Foreign Application Priority Data

Jul. 21, 2015 (KR) ........................ 10-2015-0103137

(51) Int. Cl.

| | |
|---|---|
| ***G09G 3/30*** | (2006.01) |
| ***G09G 3/3225*** | (2016.01) |
| ***H01L 27/32*** | (2006.01) |
| ***H01L 51/52*** | (2006.01) |
| ***G09G 3/20*** | (2006.01) |

(Continued)

(52) U.S. Cl.

CPC ......... *G09G 3/3225* (2013.01); *G09G 3/2003* (2013.01); *G09G 3/3233* (2013.01); *H01L 27/32* (2013.01); *H01L 51/5203* (2013.01); *H01L 51/5296* (2013.01); *G09G 2300/0842* (2013.01); *G09G 2300/0861* (2013.01); *G09G 2300/0866* (2013.01); *G09G 2310/0251* (2013.01); *G09G 2310/0262* (2013.01); *G09G 2310/08* (2013.01);

(Continued)

(58) Field of Classification Search

CPC .. G09G 3/3225; G09G 3/2003; G09G 3/3233; H01L 27/32; H01L 51/5203; H01L 51/5296

USPC .......................................... 345/76; 315/169.3

See application file for complete search history.

(56) References Cited

U.S. PATENT DOCUMENTS

| | | | | |
|---|---|---|---|---|
| 2003/0103022 A1* | 6/2003 | Noguchi | G09G 3/3233 345/77 |
| 2005/0206590 A1* | 9/2005 | Sasaki | G09G 3/3233 345/76 |

(Continued)

FOREIGN PATENT DOCUMENTS

| | | |
|---|---|---|
| KR | 10-2011-0013692 A | 2/2011 |
| KR | 10-2012-0028426 A | 3/2012 |
| KR | 10-2016-0061491 | 6/2016 |

*Primary Examiner* — Adam J Snyder

(74) *Attorney, Agent, or Firm* — Lewis Roca Rothgerber Christie LLP

(57) ABSTRACT

A pixel includes: a first transistor connected between a data line and a first node; a second transistor connected between a first power source and a second node, the second transistor including a gate electrode connected to the first node; a third transistor connected between the first power source and the second transistor; a capacitor connected between the first node and the second node; an organic light emitting diode (OLED) connected between the second node and a second power source; and a fourth transistor including a second electrode connected to a cathode of the OLED.

14 Claims, 4 Drawing Sheets

(51) Int. Cl.
*G09G 3/3233* (2016.01)
*G09G 3/10* (2006.01)

(52) U.S. Cl.
CPC ............... *G09G 2320/0233* (2013.01); *G09G 2320/045* (2013.01)

(56) References Cited

U.S. PATENT DOCUMENTS

| | | | | |
|---|---|---|---|---|
| 2007/0001956 | A1* | 1/2007 | Yeh | G09G 3/3233 345/92 |
| 2007/0032000 | A1* | 2/2007 | Yeh | G09G 3/3225 438/149 |
| 2009/0284515 | A1* | 11/2009 | Tsuge | G09G 3/3233 345/211 |
| 2010/0013806 | A1* | 1/2010 | Yoo | G09G 3/3233 345/204 |
| 2010/0033477 | A1* | 2/2010 | Yamashita | G09G 3/3233 345/215 |
| 2010/0053144 | A1* | 3/2010 | Akimoto | G09G 3/3233 345/213 |
| 2010/0066651 | A1* | 3/2010 | Lee | H01L 27/3211 345/76 |
| 2010/0182352 | A1* | 7/2010 | Nakamura | G09G 3/3233 345/691 |
| 2011/0025586 | A1 | 2/2011 | Lee | |
| 2012/0062613 | A1 | 3/2012 | Park et al. | |
| 2014/0062988 | A1* | 3/2014 | Lee | G09G 3/3233 345/212 |
| 2016/0148988 | A1 | 5/2016 | Cho et al. | |

* cited by examiner

PIXEL WITH CURRENT DIFFUSION, METHOD OF DRIVING THE PIXEL, AND ORGANIC LIGHT EMITTING DISPLAY DEVICE INCLUDING THE PIXEL

CROSS-REFERENCE TO RELATED APPLICATION

This application claims priority to, and the benefit of, Korean Patent Application No. 10-2015-0103137, filed on Jul. 21, 2015, in the Korean Intellectual Property Office, the entire contents of which are incorporated herein by reference in their entirety.

BACKGROUND

1. Field

One or more aspects of example embodiments of the present invention relate to a pixel, a method of driving the pixel, and an organic light emitting display device including the pixel.

2. Description of the Related Art

An organic light emitting display device displays an image by using an organic light emitting diode (OLED) that generates light by re-combination of electrons and holes. The organic light emitting display device has a high response speed, and may display a clear image.

In general, the organic light emitting display device includes a plurality of pixels, each having a driving transistor and an OLED. Each pixel may display a corresponding grayscale (e.g., gray level) by controlling an amount of current supplied to the OLED by using the driving transistor.

The above information disclosed in this Background section is for enhancement of understanding of the background of the invention, and therefore, it may contain information that does not constitute prior art.

SUMMARY

One or more aspects of example embodiments of the present invention relate to a pixel for improving picture quality and for displaying a high-resolution screen, a method of driving the pixel, and an organic light emitting display device including the pixel.

According to an example embodiment of the present invention, a pixel includes: a first transistor connected between a data line and a first node; a second transistor connected between a first power source and a second node, the second transistor including a gate electrode connected to the first node; a third transistor connected between the first power source and the second transistor; a capacitor connected between the first node and the second node; an organic light emitting diode (OLED) connected between the second node and a second power source; and a fourth transistor including a second electrode connected to a cathode of the OLED.

The first transistor may include a first electrode connected to the data line, a second electrode connected to the first node, and a gate electrode connected to a scan line, the second transistor may further include a first electrode connected to the third transistor, and a second electrode connected to the second node, and the third transistor may include a first electrode connected to the first power source, a second electrode connected to the first electrode of the second transistor, and a gate electrode connected to a first control line.

The fourth transistor may further include a first electrode connected to the data line, and a gate electrode connected to a second control line.

The first transistor may be configured to be in an off state, and the second transistor, the third transistor, and the fourth transistor may be configured to be in on states, during a period.

A signal supplied to the data line during the period may have a same voltage level as that of the second power source.

The fourth transistor may further include a first electrode connected to an initializing power source, and a gate electrode connected to a second control line.

A power source that is configured to be supplied to the initializing power source may have a same voltage level as that of the second power source when the fourth transistor is in an on state.

A first current path from the cathode of the OLED to the second power source, and a second current path from the cathode of the OLED to the initializing power source, may be formed when the fourth transistor is in the on state.

According to an embodiment of the present invention, an organic light emitting display device includes: a scan driver configured to supply scan signals to n (n is a natural number greater than or equal to 2) scan lines; a data driver configured to supply data signals to m (m is a natural number greater than or equal to 2) data lines; a control driver configured to supply control signals to a first control line and to a second control line; and a plurality of pixels connected to the scan lines, the data lines, the first control line, and the second control line, each of the plurality of pixels including a first sub-pixel, a second sub-pixel, and a third sub-pixel that are configured to display different colors from each other, and that are sequentially positioned, and each of the first sub-pixel, the second sub-pixel, and the third sub-pixel that is connected to an ith (i is a natural number less than or equal to m) data line includes: a first transistor connected between the ith data line and a first node; a second transistor connected between a first power source and a second node, the second transistor including a gate electrode connected to the first node; a third transistor connected between the first power source and the second transistor; a capacitor connected between the first node and the second node; and an organic light emitting diode (OLED) connected between the second node and a second power source, at least one of the first sub-pixel, the second sub-pixel, and the third sub-pixel that is connected to the ith data line including a fourth transistor including a second electrode connected to a cathode of the OLED.

The fourth transistor may further include a first electrode connected to the ith data line, and a gate electrode connected to the second control line.

The first transistor of the first sub-pixel connected to the ith data line may include a first electrode connected to the ith data line, a second electrode connected to the first node, and a gate electrode connected to a jth (j is a natural number less than or equal to n) scan line of the scan lines, the first transistor of the second sub-pixel connected to the ith data line may include a first electrode connected to the ith data line, a second electrode connected to the first node, and a gate electrode connected to a (j+1)th scan line of the scan lines, and the first transistor of the third sub-pixel connected to the ith data line may include a first electrode connected to the ith data line, a second electrode connected to the first node, and a gate electrode connected to a (j+2)th scan line of the scan lines.

A signal supplied to the ith data line may have a same voltage level as that of the second power source when the fourth transistor is in an on state.

A first current path from the cathode of the OLED to the second power source, and a second current path from the cathode of the OLED to the ith data line, may be formed when the fourth transistor is in the on state.

According to an embodiment of the present invention, a method of driving a pixel including a first transistor, a second transistor between a first power source and an organic light emitting diode (OLED), a third transistor, a fourth transistor, and a capacitor, includes: turning on the first transistor to supply a reference voltage to a gate electrode of the second transistor, while a voltage level of the first power source is at a low level; changing the voltage level of the first power source to a high level, and storing a threshold voltage of the second transistor in the capacitor; turning on the first transistor to supply a data voltage to the gate electrode of the second transistor; and supplying a driving current corresponding to the voltage stored in the capacitor from the second transistor to the OLED after turning on the fourth transistor.

After the changing of the voltage level of the first power source to the high level is performed, the voltage level of the first power source may be maintained at the high level during the storing of the threshold voltage, during the turning on of the first transistor to supply the data voltage, and during the supplying of the driving current after turning on the fourth transistor.

After the voltage level of the first power source is at the low level, the fourth transistor may maintain an off state during the turning on of the first transistor to supply the reference voltage, during the changing of the voltage level of the first power source to the high level, during the storing of the threshold voltage, and during the turning on of the first transistor to supply the data voltage are performed.

After the voltage level of the first power source is at the low level, a voltage of a second power source connected to a cathode of the OLED may be supplied at a first low level during the turning on of the first transistor to supply the reference voltage, during the changing of the voltage level of the first power source to the high level, during the storing of the threshold voltage, and during the turning on of the first transistor to supply the data voltage are performed.

The method may further include reducing the voltage of the second power source to a second low level when the fourth transistor is turned on.

The method may further include supplying a voltage having the second low level as the data voltage when the fourth transistor is turned on.

According to one or more embodiments of the present invention, there are provided a pixel capable of reducing voltage increase caused by IR drop of a second power source ELVSS (so that it may be possible to prevent or substantially prevent brightness from being reduced at a location remote from a second power source supply region), a method of driving the pixel, and an organic light emitting display device including the pixel.

According to one or more embodiments of the present invention, there are provided a pixel for improving an aperture ratio and for displaying a high-resolution screen, a method of driving the pixel, and an organic light emitting display device including the pixel.

BRIEF DESCRIPTION OF THE DRAWINGS

The above and other aspects and features of the present invention will become apparent to those skilled in the art from the following detailed description of the example embodiments with reference to the accompanying drawings, in which.

DETAILED DESCRIPTION

Figure 1:
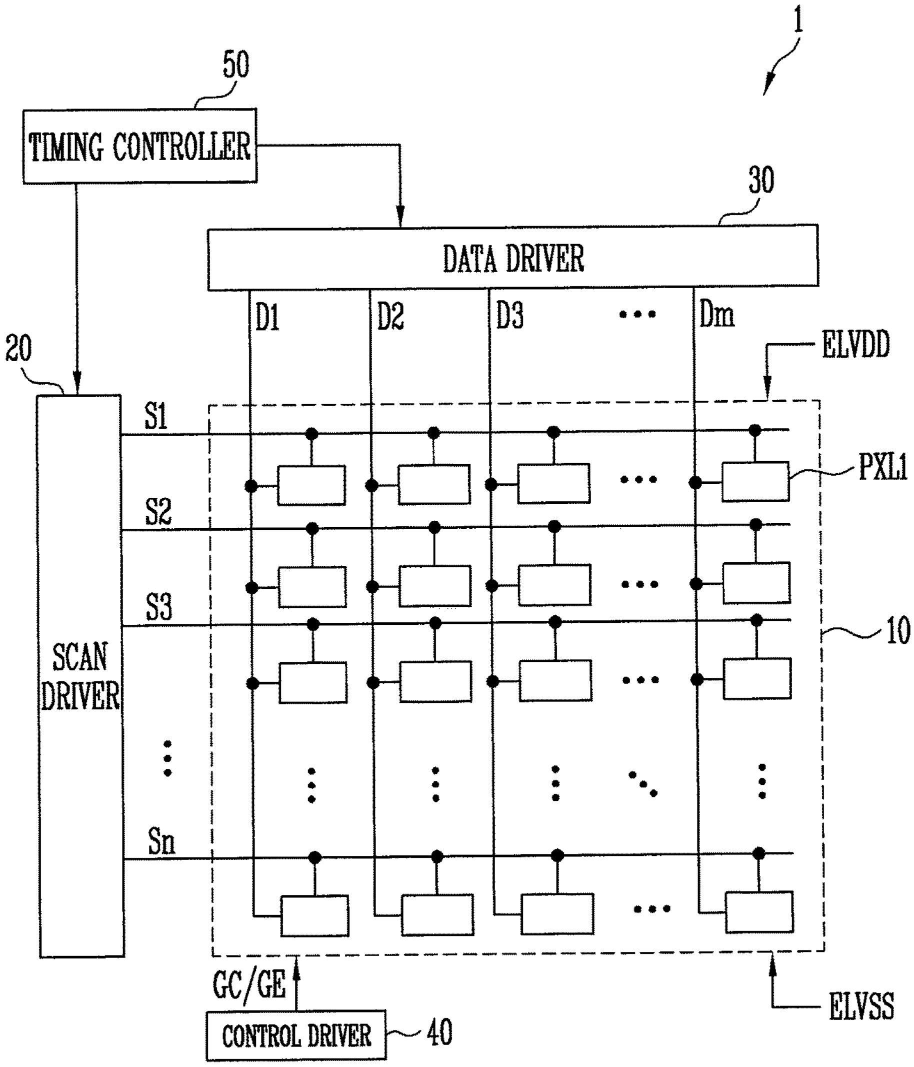
FIG. 1 is a view illustrating an organic light emitting display device according to an embodiment of the present invention.

Hereinafter, example embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a pixel according to an embodiment of the present invention, a method of driving the pixel, and an organic light emitting display device including the pixel, will be described with reference to the accompanying drawings.

FIG. 1 is a view illustrating an organic light emitting display device 1 according to an embodiment of the present invention.

Referring to FIG. 1, the organic light emitting display device 1 may include a scan driver 20, a data driver 30, a control driver 40, a timing controller 50, and a pixel area 10 including a plurality of pixels PXL1.

The organic light emitting display device 1 may further include n scan lines S1 to Sn connected between the scan driver 20 and the pixels PXL1, and m data lines D1 to Dm connected between the data driver 30 and the pixels PXL1 (here, n and m are natural numbers greater than or equal to 2).

The pixels PXL1 may be respectively connected to the n scan lines S1 to Sn, the m data lines D1 to Dm, a first control line for transmitting a first control signal GC, and a second control line for transmitting a second control signal GE.

The pixels PXL1 may receive a first power source ELVDD and a second power source ELVSS from a power source supply.

In addition, the pixels PXL1 may generate light corresponding to data signals according to current that flows from the first power source ELVDD to the second power source ELVSS via respective organic light emitting diodes (OLEDs).

The scan driver 20 generates scan signals according to control of the timing controller 50, and may supply the generated scan signals to the scan lines S1 to Sn. Therefore, the pixels PXL1 may receive the scan signals through the scan lines S1 to Sn.

The data driver 30 generates the data signals according to control of the timing controller 50, and may supply the generated data signals to the data lines D1 to Dm. Therefore, the pixels PXL1 may receive the data signals through the data lines D1 to Dm.

The control driver 40 generates the first control signal GC and the second control signal GE, and transmits the generated first and second control signals GC and GE to each of the plurality of pixels. The first and second control signals GC and GE may be concurrently (e.g., simultaneously) supplied to all of the pixels PXL1, without being provided to each of the pixels PXL1 with a time difference (e.g., a predetermined time difference).

The timing controller 50 may generate data driving control signals and scan driving control signals in response to synchronizing signals supplied from the outside (e.g., supplied from an exterior of the timing controller 50 or the display device 1). The data driving control signals generated by the timing controller 50 is supplied to the data driver 30, and the scan driving control signals may be supplied to the scan driver 20.

The timing controller 50 supplies externally supplied data to the data driver 30.

In FIG. 1, for convenience, the scan driver 20, the data driver 30, the control driver 40, and the timing controller 50 are separately illustrated. However, the present invention is not limited thereto, and at least a part of the elements may be integrated together.

Figure 2:
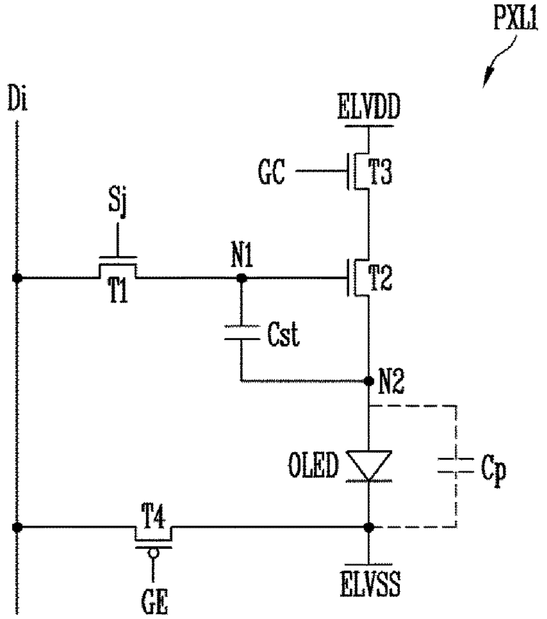
FIG. 2 is a view illustrating a pixel according to an embodiment of the present invention.

FIG. 2 is a view illustrating a pixel according to an embodiment of the present invention.

In particular, for convenience, a pixel PXL1 connected to a jth scan line Sj and an ith data line Di is illustrated in FIG. 2 (here, j is a natural number less than or equal to n, and i is a natural number less than or equal to m).

Referring to FIG. 2, the pixel PXL1 may include a first transistor T1, a second transistor T2, a third transistor T3, a fourth transistor T4, a capacitor Cst, and an OLED.

The first transistor T1 may be connected between the data line Di and a first node N1. For example, a first electrode of the first transistor T1 may be connected to the data line Di, a second electrode of the first transistor T1 may be connected to the first node N1, and a gate electrode of the first transistor T1 may be connected to the jth scan line Sj. Therefore, the first transistor T1 may be turned on in response to a scan signal supplied to the jth scan line Sj.

When the first transistor T1 is turned on, a data signal of the data line Di may be transmitted to the first node N1.

The second transistor T2 may be connected between the first power source ELVDD and a second node N2. For example, a first electrode of the second transistor T2 may be connected to the third transistor T3 (to be described later), a second electrode of the second transistor T2 may be connected to the second node N2, and a gate electrode of the second transistor 12 may be connected to the first node N1.

The second transistor T2 may function as a driving transistor for supplying a driving current to the OLED. For example, the second transistor T2 may supply the driving current corresponding to a voltage stored in the capacitor Cst to the OLED.

The third transistor T3 may be connected between the first power source ELVDD and the second transistor T2. For example, a first electrode of the third transistor T3 may be connected to the first power source ELVDD, a second electrode of the third transistor 13 may be connected to the first electrode of the second transistor T2, and a gate electrode of the third transistor 13 may be connected to the first control line. Therefore, the third transistor 13 may be turned on in response to the first control signal GC supplied to the first control line.

The fourth transistor T4 may be connected between the ith data line Di and the OLED.

For example, a first electrode of the fourth transistor T4 may be connected to the ith data line Di, a second electrode of the fourth transistor T4 may be connected to a cathode of the OLED, and a gate electrode of the fourth transistor 14 may be connected to the second control line. Therefore, the fourth transistor 14 may be turned on in response to the second control signal GE supplied to the second control line.

When the fourth transistor T4 is turned on, a current that flows to a wiring line to which the second power source ELVSS is connected may be diffused to the ith data line Di.

Here, the first electrodes of the first to fourth transistors T1, T2, T3, and T4 may be source electrodes or drain electrodes, and the second electrodes of the first to fourth transistors T1, 12, 13, and T4 may be electrodes different from the first electrodes. For example, when the first electrodes are the drain electrodes, the second electrodes may be the source electrodes.

Each of the first to fourth transistors T1, 12, 13, and T4 may include an n channel type transistor (e.g., an n channel transistor) or a p channel type transistor (e.g., a p channel transistor).

Therefore, the first to fourth transistors T1, T2, 13, and 14 may be implemented by amorphous silicon thin film transistors (a-Si TFT), oxide thin film transistors (oxide TFT), and/or polycrystalline-silicon thin film transistors (poly-Si TFT).

An n channel type transistor may be turned off when a control signal is at a low level, and may be turned on when the control signal is at a high level. In addition, the n channel type transistor may have a higher operation speed than a p channel type transistor, and may be suitable for manufacturing a large area display device.

That is, electrons have higher mobility than holes. Because the n channel type transistor uses the electrons as carriers, the n channel type transistor may have a higher response speed to the control signal than that of the p channel type transistor that uses the holes as carriers.

On the other hand, when the first to fourth transistors T1, T2, 13, and T4 are implemented by the oxide TFT, an active layer of each of the first to fourth transistors T1, T2, T3, and T4 may include an oxide semiconductor.

The oxide semiconductor may be an oxide including at least one of titanium (Ti), hafnium (Hf), zirconium (Zr), aluminum (Al), tantalum (Ta), germanium (Ge), zinc (Zn), gallium (Ga), tin (Sn), and indium (In).

The capacitor Cst may be connected between the first node N1 and the second node N2. For example, a first electrode of the capacitor Cst may be connected to the first node N1, and a second electrode of the capacitor Cst may be connected to the second node N2.

The OLED may be connected between the second node N2 and the second power source ELVSS. For example, an anode electrode of the OLED may be connected to the second node N2, and a cathode electrode of the OLED may be connected to the second power source ELVSS.

The OLED receives the driving current from the second transistor T2, and may emit light having a brightness corresponding to the driving current.

In addition, as shown with a dotted line, a parasitic capacitor Cp may be formed in the OLED.

The first transistor T1, the second transistor T2, and the capacitor Cst may be commonly connected to the first node N1. For example, the second electrode of the first transistor T1, the gate electrode of the second transistor T2, and the first electrode of the capacitor Cst may be commonly connected to the first node N1.

The second transistor T2, the capacitor Cst, and the OLED may be commonly connected to the second node N2. For example, the second electrode of the second transistor 12, the second electrode of the capacitor Cst, and the anode electrode of the OLED may be commonly connected to the second node N2.

The first power source ELVDD may be a high potential power source, and the second power source ELVSS may be a low potential power source. In addition, the first power source ELVDD and the second power source ELVSS may change (e.g., swing) to different voltage values in accordance with driving flow of the pixel PXL1.

Figure 3:
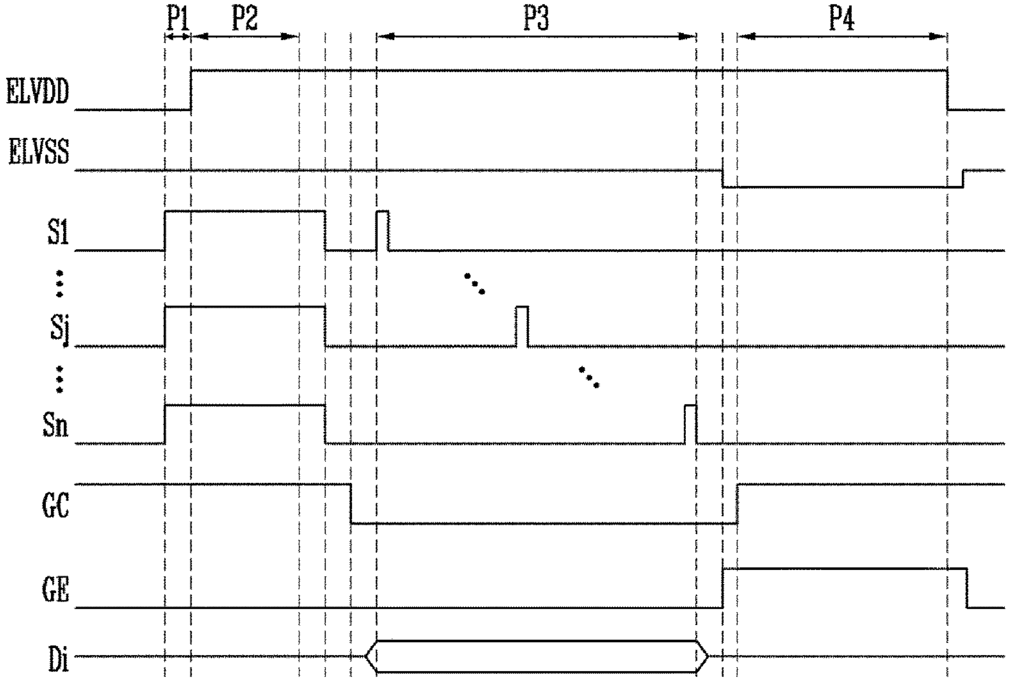
FIG. 3 is a waveform diagram illustrating a method of driving a pixel according to an embodiment of the present invention.

FIG. 3 is a waveform diagram illustrating a method of driving a pixel according to an embodiment of the present invention.

Referring to FIGS. 2 and 3, a driving operation of a pixel will be described.

Referring to FIG. 3, the method of driving the pixel PXL1 according to an embodiment of the present invention may include an initializing process, a threshold voltage compensating process, a data inputting process, and a light emitting process.

The initializing process may be performed during a first period P1. During the initializing process, a driving voltage of the OLED in the pixel PXL1 is reset (e.g., initialized). A voltage of the gate electrode of the driving transistor, that is, the second transistor T2 of each pixel PXL1, is set as a reference voltage (e.g., a predetermine reference voltage or a reset voltage).

When a light emitting period of a previous frame ends, a voltage level of the first power source ELVDD changes (e.g., swings) from a high potential to a low potential, and the second control signal GE of the second control line increases from a low level to a high level. That is, the fourth transistor T4 is turned off.

In addition, the scan signals S1 to Sn corresponding to the pixels are transited from low levels to high levels, and are transmitted to the scan lines.

Reference voltages having the same value are transmitted through the data lines D1 to Dm connected to the pixels PXL1.

A scan signal is supplied to turn on the first transistor T1, and the reference voltage is supplied to the first node N1.

Although a value of the reference voltage is not limited, the value of the reference voltage may be in a range of a data voltage in accordance with an image data signal.

At this time, a ground voltage (e.g., a low potential) is applied to the first power source ELVDD during the first period P1, so that a current does not flow from the second transistor T2 to the OLED. Therefore, because a current path to the cathode electrode of the OLED may be blocked, operation of the pixel PXL1 may be correctly performed.

Next, the threshold voltage compensating process may be performed during a second period P2. During the threshold voltage compensating process, a threshold voltage of the driving transistor, that is, the second transistor T2 of each pixel PXL1, is compensated.

Because the second transistors T2 of the pixels PXL1 included in the display device 1 have different threshold voltages in accordance with a manufacturing process or a material characteristic of a panel, due to a variation in threshold voltages, it is difficult to correctly display brightness having uniformity in the pixels PXL1.

Therefore, to reduce non-uniformity in brightness in accordance with the variation in threshold voltages of the second transistors T2 of the pixels PXL1, the threshold voltages of the second transistors T2 of all of the pixels PXL1 are to be compensated for at once (e.g., are to be concurrently or simultaneously compensated).

When the initializing process ends, the first power source ELVDD is transited to a high level, and the storage capacitor Cst may store the threshold voltage of the second transistor T2.

The data inputting process may be performed during a third period P3. During the data inputting process, the first transistor T1 is turned on so that a data signal may be supplied to the first node N1. Therefore, during the data inputting process, the data signal transmitted from the ith data line Di may be supplied to the first node N1.

Accordingly, during the third period P3, the scan signal (for example, a high-level signal) may be supplied to the jth scan line Sj. For example, the scan signals may be supplied to the scan lines S1 to Sn sequentially.

Therefore, during the third period P3, the second transistor T2 may be in an on state, and the third transistor T3 that receives the first control signal GC at a low level from the first control line may be in an off state. At this time, the fourth transistor T4 may also be in an off state.

During the third period P3, a voltage of the first node N1 may be maintained or substantially maintained as a voltage (hereinafter, referred to as a data voltage) of the data signal.

The light emitting process may be performed during a fourth period P4. During the light emitting process, the driving current corresponding to the voltage stored in the capacitor Cst may be supplied from the second transistor 12 to the OLED.

Accordingly, during the fourth period P4, the scan signal is not supplied to the scan line Sj. That is, during the fourth period P4, the first transistor T1 may be in an off state.

During the fourth period P4, the third transistor T3 that receives the first control signal GC at a high level from the first control line may be in an on state, so that a current path is formed from the first power source ELVDD to the second power source ELVSS (e.g., through the third transistor T3, the second transistor T2, and the OLED).

Further, during the fourth period P4, the fourth transistor T4 that receives the second control signal GE at a high level is in an on state, so that a current path is formed from the first power source ELVDD to the first electrode of the fourth transistor T4, that is, to the ith data line Di. That is, a current path from the first power source ELVDD to the OLED may be divided into a first current path from the cathode of the OLED to the second power source ELVSS and a second current path from the cathode of the OLED to the ith data line Di.

At this time, so that the current path may be divided into the first current path and the second current path, during the fourth period P4, the voltage level of the second power source ELVSS may be the same or substantially the same as the level of the voltage supplied to the ith data line Di. For example, when the ground voltage is applied to the second power source ELVSS, a signal having a voltage level that is equal to or substantially equal to 0V may be supplied to the ith data line Di.

According to an embodiment of the present invention, because the second power source ELVSS having a higher voltage is supplied from a location that is remote to a second power source supply region, brightness is reduced due to wiring line resistance of the second power source ELVSS, and non-uniformity in brightness may be reduced by diffusing a current that flows to the second power source ELVSS.

In addition, because a data line Di is used as a wiring line for diffusing the current that flows to the second power source ELVSS, that is, because an additional auxiliary wiring line is omitted, it may be possible to secure an aperture ratio and to provide a pixel that is desirable for having a high resolution.

Figure 4:
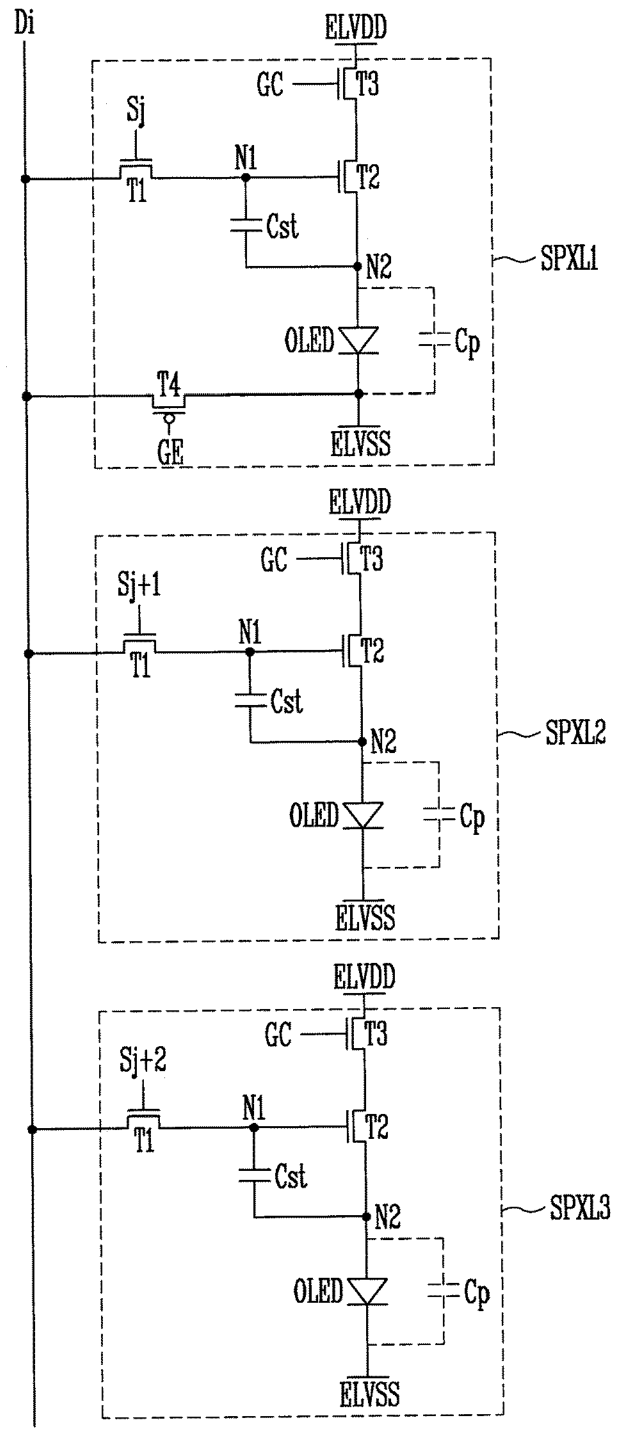
FIG. 4 is a view illustrating a unit pixel of an organic light emitting display device according to an embodiment of the present invention.

FIG. 4 is a view illustrating a unit pixel of an organic light emitting display device according to an embodiment of the present invention. Hereinafter, repeated description of the elements that are the same or substantially the same as those described above may be omitted, and detailed description of different elements will be described in more detail.

The organic light emitting display device may include a plurality of unit pixels, each including a first sub-pixel SPXL1, a second sub-pixel SPXL2, and a third sub-pixel SPXL3.

The first sub-pixel SPXL1, the second sub-pixel SPXL2, and the third sub-pixel SPXL3 may be configured to emit the three primary colors of red, green, and blue, or to emit yellow, cyan, and magenta, but the present invention is not limited thereto.

For example, other than the three primary colors, a mixed color of the three primary colors and/or white may be emitted.

Referring to FIG. 4, the fourth transistor T4 may be provided in each unit pixel (e.g., in the first sub-pixel SPXL1 of each unit pixel).

That is, the sub-pixels of the organic light emitting display device may omit the fourth transistor T4, but at least one of the first sub-pixel SPXL1, the second sub-pixel SPXL2, and the third sub-pixel SPXL3 may include the fourth transistor T4.

In FIG. 4, for convenience, the second power sources ELVSS connected to the sub-pixels SPXL1, SPXL2, and SPXL3 are illustrated as being separated. However, the sub-pixels SPXL1, SPXL2, and SPXL3 may use a common second power source wiring line.

In this case, the first to third sub-pixels SPXL1, SPXL2, and SPXL3 may commonly use the fourth transistor T4, so that the aperture ratio may be secured, and so that a space may be reduced.

While it is illustrated in FIG. 4 that one fourth transistor T4 is provided for the three sub-pixels SPXL1, SPXL2, and SPXL3, the number of sub-pixels that form a unit pixel PXL1 is not limited thereto.

Figure 5:
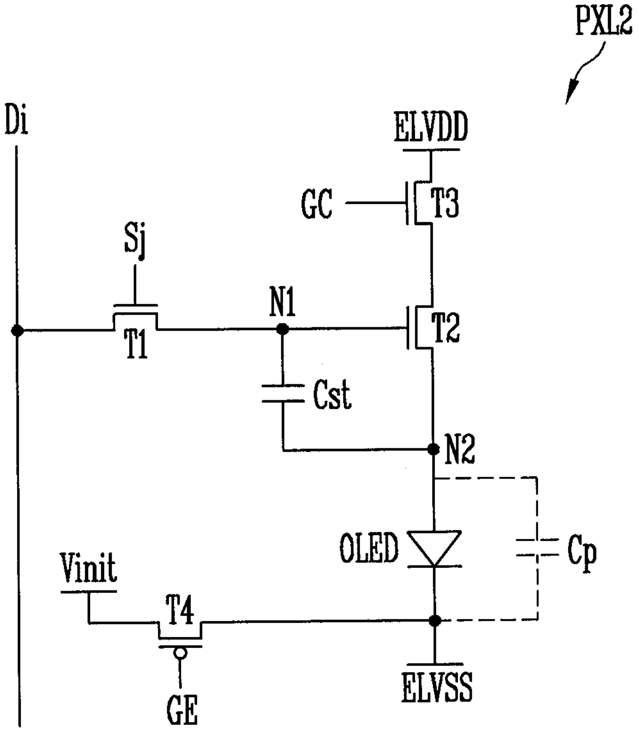
FIG. 5 is a view illustrating a pixel according to another embodiment of the present invention.

FIG. 5 is a view illustrating a pixel according to another embodiment of the present invention.

Referring to FIG. 5, a second electrode of the fourth transistor T4 may be connected to the cathode of the OLED, a first electrode of the fourth transistor T4 may be connected to an initializing power source Vinit, and a gate electrode of the fourth transistor T4 may be connected to the second control line GE.

The fourth transistor T4 is turned on during a light emitting period during which the OLED emits light. Therefore, the first current path from the cathode of the OLED to the second power source ELVSS, and a second current path from the cathode of the OLED to the initializing power source Vinit, may be formed.

Accordingly, in the case in which there may be limitations on widely forming the data lines D1 to Dm, or widely forming a wiring line width of the second power source ELVSS, it might not be suitable or desirable to have the first electrode of the fourth transistor T4 connected to the data line Di, as described above, to diffuse a current into the second current path so that non-uniformity in brightness does not occur. Accordingly, as illustrated in FIG. 5, an additional initializing power source Vinit wiring line may be provided.

As illustrated in FIG. 5, when the initializing power source Vinit is provided, a voltage having the same or substantially the same level as that of the voltage supplied to the second power source ELVSS may be supplied (e.g., continuously supplied) to the initializing power source Vinit during the light emitting period.

For example, when the second power source ELVSS is grounded during the light emitting period, the initializing power source Vinit may be grounded.

Because the other elements and content described with reference to FIGS. 1, 2, and 3 may be applicable to the sub-pixels SPXL1, SPXL2, and SPXL3 of FIG. 4, and to the pixel PXL2 of FIG. 5, repeat description thereof have been omitted.

Example embodiments have been disclosed herein, and although specific terms are employed, they are used and are to be interpreted in a generic and descriptive sense and not for purposes of limitation. In some cases, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made without departing from the spirit and scope of the present invention as set forth in the following claims, and their equivalents.

What is claimed is:

1. A pixel comprising:

a first transistor connected between a data line and a first node;

a second transistor connected between a first power source and a second node, the second transistor comprising a gate electrode connected to the first node;

a third transistor connected between the first power source and the second transistor;

a capacitor connected between the first node and the second node;

an organic light emitting diode (OLED) connected between the second node and a second power source; and a fourth transistor comprising a first electrode connected to the data line and a second electrode connected to a cathode of the OLED, wherein a signal having the same voltage level as that of the second power source is supplied to the data line when the fourth transistor is in an on state, and wherein the first transistor is configured to be in an off state, and the second transistor, the third transistor, and the fourth transistor are configured to be in on states, during a period.

2. The pixel of claim 1, wherein the first transistor comprises a first electrode connected to the data line, a second electrode connected to the first node, and a gate electrode connected to a scan line, wherein the second transistor further comprises a first electrode connected to the third transistor, and a second electrode connected to the second node, and wherein the third transistor comprises a first electrode connected to the first power source, a second electrode connected to the first electrode of the second transistor, and a gate electrode connected to a first control line.

3. The pixel of claim 1, wherein the fourth transistor further comprises a gate electrode connected to a second control line.

4. The pixel of claim 1, wherein the signal having the same voltage level as that of the second power source is supplied to the data line.

5. The pixel of claim 1, wherein a first current path from the cathode of the OLED to the second power source, and a second current path from the cathode of the OLED to the data line, are formed when the fourth transistor is in the on state.

6. An organic light emitting display device comprising:

a scan driver configured to supply scan signals to n (n is a natural number greater than or equal to 2) scan lines;

a data driver configured to supply data signals to m (m is a natural number greater than or equal to 2) data lines;

a control driver configured to supply control signals to a first control line and to a second control line; and a plurality of pixels connected to the scan lines, the data lines, the first control line, and the second control line, each of the plurality of pixels comprising a first sub-pixel, a second sub-pixel, and a third sub-pixel that are configured to display different colors from each other, and that are sequentially positioned, wherein each of the first sub-pixel, the second sub-pixel, and the third sub-pixel that is connected to an ith (i is a natural number less than or equal to m) data line comprises:

a first transistor connected between the ith data line and a first node;

a second transistor connected between a first power source and a second node, the second transistor comprising a gate electrode connected to the first node;

a third transistor connected between the first power source and the second transistor;

a capacitor connected between the first node and the second node; and an organic light emitting diode (OLED) connected between the second node and a second power source, wherein at least one of the first sub-pixel, the second sub-pixel, and the third sub-pixel that is connected to the ith data line comprises a fourth transistor comprising a first electrode connected to the ith data line and a second electrode connected to a cathode of the OLED, wherein a signal having the same voltage level as that of the second power source is supplied to the ith data line when the fourth transistor is in an on state, and wherein the first transistor is configured to be in an off state, and the second transistor, the third transistor, and the fourth transistor are configured to be in on states, during a period.

7. The organic light emitting display device of claim 6, wherein the fourth transistor further comprises a gate electrode connected to the second control line.

8. The organic light emitting display device of claim 7, wherein the first transistor of the first sub-pixel connected to the ith data line comprises a first electrode connected to the ith data line, a second electrode connected to the first node, and a gate electrode connected to a jth (j is a natural number less than or equal to n) scan line of the scan lines, wherein the first transistor of the second sub-pixel connected to the ith data line comprises a first electrode connected to the ith data line, a second electrode connected to the first node, and a gate electrode connected to a (j+1)th scan line of the scan lines, and wherein the first transistor of the third sub-pixel connected to the ith data line comprises a first electrode connected to the ith data line, a second electrode connected to the first node, and a gate electrode connected to a (j+2)th scan line of the scan lines.

9. The organic light emitting display device of claim 7, wherein a first current path from the cathode of the OLED to the second power source, and a second current path from the cathode of the OLED to the ith data line, are formed when the fourth transistor is in the on state.

10. A method of driving a pixel comprising a first transistor, a second transistor between a first power source and an organic light emitting diode (OLED), a third transistor, a fourth transistor comprising a first electrode connected to a data line and a second electrode connected to a cathode of the OLED, and a capacitor, the method comprising:

turning on the first transistor to supply a reference voltage to a gate electrode of the second transistor, while a voltage level of the first power source is at a low level;

changing the voltage level of the first power source to a high level, and storing a threshold voltage of the second transistor in the capacitor;

turning on the first transistor to supply a data voltage to the gate electrode of the second transistor through the data line;

supplying a driving current corresponding to a voltage stored in the capacitor from the second transistor to the OLED after turning on the fourth transistor; and supplying a voltage having a second low level as the data voltage to the data line when the fourth transistor is turned on, wherein the cathode of the OLED is connected to a second power source, and wherein the first transistor is configured to be in an off state, and the second transistor, the third transistor, and the fourth transistor are configured to be in on states, during a period.

11. The method of claim 10, wherein after the changing of the voltage level of the first power source to the high level is performed, the voltage level of the first power source is maintained at the high level during the storing of the threshold voltage, during the turning on of the first transistor to supply the data voltage, and during the supplying of the driving current after turning on the fourth transistor.

12. The method of claim 10, wherein after the voltage level of the first power source is at the low level, the fourth transistor maintains an off state during the turning on of the first transistor to supply the reference voltage, during the changing of the voltage level of the first power source to the high level, during the storing of the threshold voltage, and during the turning on of the first transistor to supply the data voltage are performed.

13. The method of claim 12, wherein after the voltage level of the first power source is at the low level, a voltage of the second power source is supplied at a first low level during the turning on of the first transistor to supply the reference voltage, during the changing of the voltage level of the first power source to the high level, during the storing of the threshold voltage, and during the turning on of the first transistor to supply the data voltage are performed.

14. The method of claim 13, further comprising reducing the voltage of the second power source to the second low level when the fourth transistor is turned on.

* * * * *